United States Patent [19]

Green

[11] Patent Number: 4,855,670

[45] Date of Patent: * Aug. 8, 1989

[54] METHOD OF PROVIDING INFORMATION USEFUL IN IDENTIFYING DEFECTS IN ELECTRONIC CIRCUITS

[75] Inventor: Morris H. Green, Milwaukie, Oreg.

[73] Assignee: Tektronix, Inc., Beaverton, Oreg.

[ * ] Notice: The portion of the term of this patent subsequent to Mar. 1, 2005 has been disclaimed.

[21] Appl. No.: 168,523

[22] Filed: Mar. 7, 1988

Related U.S. Application Data

[63] Continuation of Ser. No. 712,585, Mar. 15, 1985, abandoned.

[51] Int. Cl.$^4$ ..................... G01R 31/00; G01R 31/28
[52] U.S. Cl. ................. 324/73 R; 324/158 R; 371/20; 371/25
[58] Field of Search ........... 324/73 R, 158 R, 73 AT; 371/20, 21, 25; 365/201

[56] References Cited

U.S. PATENT DOCUMENTS

| | | | |
|---|---|---|---|
| 3,761,695 | 9/1973 | Eichelberger | 371/25 |
| 4,369,511 | 1/1983 | Kimura et al. | 371/21 X |
| 4,503,536 | 3/1985 | Panzer | 324/73 R X |
| 4,534,028 | 8/1985 | Trischler | 371/25 |
| 4,571,724 | 2/1986 | Belmondo et al. | 324/73 R X |
| 4,631,724 | 12/1986 | Shimizu | 324/73 R |
| 4,728,883 | 3/1988 | Green | 324/158 R |

OTHER PUBLICATIONS

Sugamori et al.; "Analysis and Definition of Overall Timing Accuracy in VLSI Test System"; 1981 IEEE Test Conference; pp. 143–153.

Primary Examiner—Reinhard J. Eisenzopf
Assistant Examiner—Vinh P. Nguyen
Attorney, Agent, or Firm—John Smith-Hill; Robert S. Hulse

[57] ABSTRACT

An electronic circuit is tested by applying a sequence of test vectors to the input port of the circuit as a plurality of sub-sequences each including at least one test vector. Serial scan vectors provided at a serial scan port of the circuit are examined after each sub-sequence, and determination is made as to whether a part of the serial scan vector indicates the presence of a defect in the circuit. In the event that a part of the serial scan vector indicates the presence of a defect in the circuit, information that identifies the number of serial scan vectors that have previously been examined and the part of the serial scan vector that indicates the presence of a defect in the circuit is made available for analysis.

10 Claims, 2 Drawing Sheets

METHOD OF PROVIDING INFORMATION USEFUL IN IDENTIFYING DEFECTS IN ELECTRONIC CIRCUITS

This is a continuation of application Ser. No. 712,585 filed 3/15/85 and now abandoned.

This invention relates to a method of providing information useful in identifying defects in electronic circuits.

BACKGROUND OF THE INVENTION

In the design of a complex integrated circuit (IC), one of the first steps is the preparation of a mathematical model of the proposed circuit. The mathematical model is used to simulate the operation of the proposed circuit and thereby confirm that an IC that performs in the manner of the model will, in fact, accomplish the desired result. Assuming that the simulation shows that the IC will perform as desired, the mathematical model is used to generate the fabrication masks for the IC. Once the masks have been generated, a prototype IC can be manufactured.

The manufacture of a complex integrated circuit, such as a microprocessor, a computer interface, a complex combinational logic circuit, etc., is an extremely costly and time-consuming operation. For this reason, it is important that errors in design of the IC be identified as soon as possible, before commencing manufacture of production parts. Therefore, it is usual to test a prototype IC, by comparing the operation of the prototype IC with the operation of the mathematical model, so that if the comparison indicates a design defect, the design of the IC can be altered before resources are committed to manufacture of production ICs.

Clearly, since the fabrication masks are generated directly from the mathematical model, the prototype IC should perform precisely in accordance with the mathematical model provided that the operation of generating the fabrication masks is performed properly and there are no manufacturing defects. However, the design system used for generating the masks might result in masks being produced that, for example, do not provide sufficient tolerance on the spaces between certain elements of the IC. The IC with no manufacturing defects might then function satisfactorily under ideal conditions of temperature, supply voltage, clock frequency, etc., but not perform adequately under more stringent conditions. As the operating conditions are made increasingly severe, successively more subtle design defects may manifest themselves.

It will be understood by those skilled in the art that exhaustive testing of a complex IC is itself a time consuming operation. When using a conventional semiconductor test system, such as the Tektronix S-3295, the mathematical model is used to make a software simulator of the desired IC, and input vectors, generated with the aid of the mathematical model, are applied to the simulator, as if it were the actual IC performing under normal conditions, and the output vectors generated by the IC are stored. The two sequences of vectors form a data base that is used to test the prototype IC. The test system then applies the same sequence of input vectors to the input port of the circuit and examines the output port, and by comparing each actual output vector with the output vector that was previously obtained using the simulator, the test system can determine whether the prototype circuit has provided the correct response to the input vector and thus whether the prototype circuit contains a design defect.

It will be appreciated that this type of test does not yield very detailed information concerning the location of the defective circuit element. In order to mitigate this disadvantage, some complex integrated circuits are designed with two distinct operational modes, namely a normal mode, in which the circuit performs its normal function in relation to other circuits, and a diagnostic mode which is specifically intended to facilitate testing of the circuit. One feature that may be designed into such a circuit is a serial scan capability. Thus, as shown in FIG. 1, a computer interface circuit 2 may receive an input vector at its input port 4 on 100 or so lines, and the circuit performs various logical operations upon the digits of the input vector in order to provide an output vector at the output port 6. Assuming that these logical operations can be broken down into several discrete stages, the input vector is applied, by way of the input port, to a first logic stage 10 which performs a first series of logical operations and provides at its output a first intermediate vector on lines 12. The intermediate vector may contain 100 or so bits and accordingly the output from the first logic stage would itself have 100 or so lines. The output lines of the first logic stage 10 are connected to the inputs of respective cells of a shift register 14. Depending on the condition of a status pin 15, the shift register is operable either as a parallel-in, parallel-out register (normal mode) or as a parallel (or serial) -in, serial-out register (diagnostic mode). In the normal mode, the first intermediate vector that is clocked into the shift register 14 is immediately clocked into a second logic stage 16. The second logic stage performs logical operations on the first intermediate vector and provides at its output port 18 a second intermediate vector on lines 22. Again, the second intermediate vector might comprise 100 or so bits. The second intermediate vector is clocked into a second shift register 20. In addition to providing the second intermediate vector, the second logic stage might provide a subsidiary vector to the first logic stage on lines 24.

In the normal mode, the vector that is clocked into the shift register 20 is immediately clocked into a third logic stage, which provides at its output port the ultimate output vector of the circuit. The third logic stage might also provide one or more subsidiary vectors on lines 26 to the first and second logic stages for use in the logical operations performed by those stages.

The shift registers 14 and 20 are included in the circuit in order to provide an indication of the status of the internal components of the circuit. Thus, if the voltage level applied to the status pin 15 places the shift registers in their diagnostic mode the intermediate vectors are made available to the exterior of the circuit by way of a serial scan port 28. This could be done by connecting the several shift registers in series, with the final cell connected to a single serial scan output pin, so that the intermediate vectors are clocked through the registers in series and the bits of the vectors can be examined sequentially. It will also be recognized that, with appropriate connections to the internal shift registers of the IC for example a scan input pin 29, particular vectors may be clocked into the IC to initialize the registers to a preferred state. This may result in saving test time, since a very long sequence of input vectors may be required to place the registers in the same state. Thus, both the ability to initialize the registers and to read out the intermediate vectors result from use of the scan testing technique.

Although the intermediate vectors may be clocked out of the IC through a single serial scan output pin, a more favorable arrangement is one in which each register is connected to its own serial scan pin of the port 28, as shown in solid lines in FIG. 1. Because each shift register may comprise 100 or more cells, even when each shift register has its own serial scan pin the operation of clocking the intermediate vectors out of the shift registers is quite time consuming. It is therefore preferred that each shift register be broken down into several segments, so that there is a total of, e.g., 16 segments, and each segment is connected to its own pin of the serial scan port as shown in broken lines in FIG. 1. Obviously, it is desirable that each segment contain substantially the same number of cells.

In the art of design and manufacture of large integrated circuits, the term "vector" denotes a digital word. Thus, an input vector is a digital word that is applied to the input port of the IC. Generally, the individual digits of a vector exist in parallel on respective lines of a multiple line conductor, and it is in this sense that the term "intermediate vector" is applied to the digits that enter the shift register 14 on the lines 12. However, when these digits are clocked out of the shift register in the diagnostic mode of the IC, they are clocked out in series, not in parallel. Nevertheless, because of the origin of the digits it is convenient to continue to refer to them as a vector, specifically as a serial scan vector. Hereinafter, the term "serial scan vector" is used to refer to a vector, or a part of a vector, that is generated in the interior of an IC and the digits of which are made available sequentially at the exterior of the IC.

As before, in order to test a circuit of the kind shown in FIG. 1, a software simulator of the circuit is made from the mathematical model, and one or more input vectors 30 (FIG. 2), simulating the operating conditions of the IC, are applied to the input port of the simulator with the shift registers 14, 20 in the normal mode. The registers are then switched to the diagnostic mode and the serial scan vectors 32 are clocked out of the output port of the simulator. In addition, the next intermediate vector may be scanned into the shift registers from the scan input pin 29. The shift registers are then returned to the normal mode, and one or more additional vectors are applied to the input port. The shift registers are switched to the diagnostic mode, and the serial scan vectors 32 are again clocked out of the registers by way of the serial scan port. Many input vectors are applied to the input port in this manner, and the input vectors and serial scan vectors form a data base that is used to test the prototype IC. The sequence of input vectors is stored in a force memory, that is so called because it is the input vector that forces a response by the IC, and the serial scan vectors are stored in a compare memory, so called because it contains the vectors that were generated by the simulator and with which the actual vectors generated by the IC are compared. In carrying out a test on a prototype IC, the test system applies the sequence of input vectors from the force memory to the IC and compares the serial scan vectors provided by the IC with the contents of the compare memory in order to identify defects. It is usual to perform several tests on an IC, under successively more demanding conditions of, e.g. temperature, voltage levels and clock speed, in order to confirm that the IC functions not only under ideal conditions but also at the limits of its rated specifications. The different tests may be carried out using the same data base, or a special data base might be developed for a particular test. The test under ideal conditions would reveal manufacturing defects and the tests under more severe conditions would be expected to reveal design defects.

It will be recognized that each group 34 of serial scan vectors that is clocked out of the IC when the IC is placed in its diagnostic mode comprises a matrix of digits, the columns being the serial scan vectors and the rows being the sets of digits that are made available at the serial scan port of the IC on successive clocks. It will also be appreciated that since the segments of the registers might not be all of the same length, some of the digits in the matrix might be meaningless. However, there is a fixed relationship between the digit positions of the successive groups of serial scan vectors, in that the status of any particular cell of a shift register (or segment thereof) is always represented in successive groups of serial scan vectors by the same digit of the same vector.

It will be seen that the ability to examine the serial scan vectors provided by the IC permits a higher level of discrimination in testing the IC, in that it provides information regarding the likely location of a design defect.

It is, of course, important that spurious indications of defects should not be given. Therefore the data base contains, in addition to the force memory and the compare memory, a third memory that is known as a mask memory. The mask memory identifies digits of the serial scan vectors as to which no determination of correctness should be made. This might be, for example, because the value of the digit is indeterminate (it could be either a one or a zero), or its value is irrelevant to that particular portion of the test. The information contained in the mask memory is therefore used to prevent the test system from giving an error or defect indication as a result of the comparison made between particular digits of the serial scan vectors provided by the prototype IC and the corresponding digits of the compare memory.

Applying test vectors to the entire 100 or so pins of the input port may not be a very efficient way of identifying defects in an integrated circuit. By appropriate choice of the test vectors, it is possible to carry out comprehensive tests using test vectors having many fewer digits. Accordingly, some circuits are designed not only to have a normal and a diagnostic mode, but also to have a diagnostic input port having as few as 16 pins. In fact, several of these pins might be pins of the normal input port but having two internal connections (normal and diagnostic) depending on the voltage applied to a status pin.

When carrying out a serial scan test, the group of serial scan vectors is examined and the digits in that group that indicate the presence of a defect in the circuit are identified. Hitherto, this identification has simply been in the form of an indication of the position, in the sequence of groups of serial scan vectors that is generated during the test, of the digit that indicates the presence of a defect, i.e., the address of the location in the compare memory for which the value of the corresponding digit of a serial scan vector indicated a defect. The sequence of serial scan vectors may comprise as many as 64K digits, and consequently it is difficult for a user to identify meaningful patterns in the error indications.

SUMMARY OF THE INVENTION

According to the present invention there is provided a method of testing an electronic circuit of the kind having an input port for receiving input vectors, an output port for providing output vectors, and a serial scan port for providing at least one serial scan vector reflecting the status of pre-determined elements within the circuit, said method comprising applying a sequence of test vectors to the input port as a plurality of sub-sequences each including at least one test vector, examining the serial scan vector after each sub-sequence and determining whether a part of the serial scan vector indicates the presence of a defect in the circuit, and, in the event that a part of the serial scan vector indicates the presence of a defect in the circuit, separately storing information that indicates the number of serial scan vectors that have previously been examined and information that identifies which part of the serial scan vector indicates the presence of defects in the circuit.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figures 1, 2:
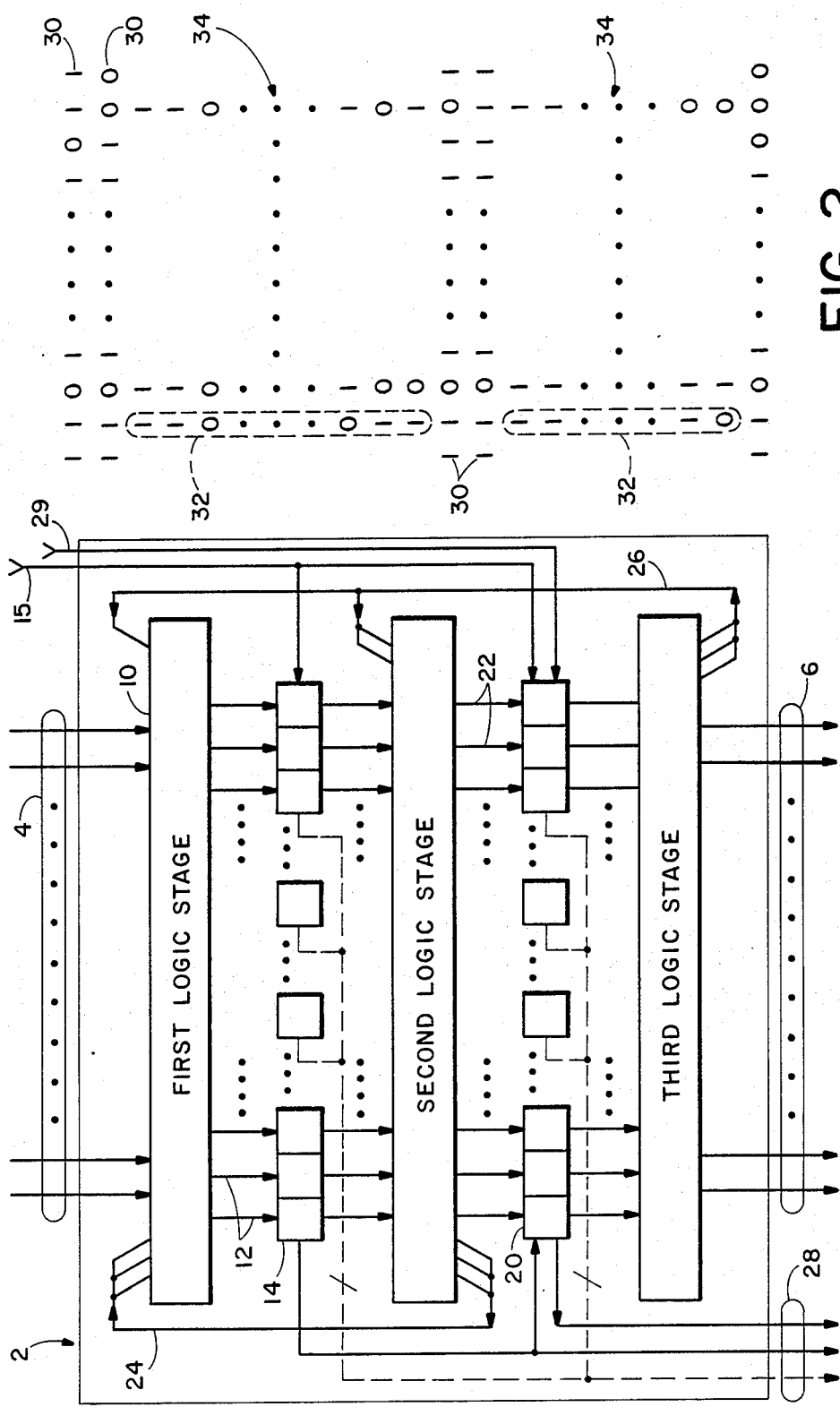
FIG. 1 illustrates in block form the organization of an integrated circuit having a serial scan port.
FIG. 2 represents in simplified form a sequence of test vectors and serial scan vectors.
Figure 3:
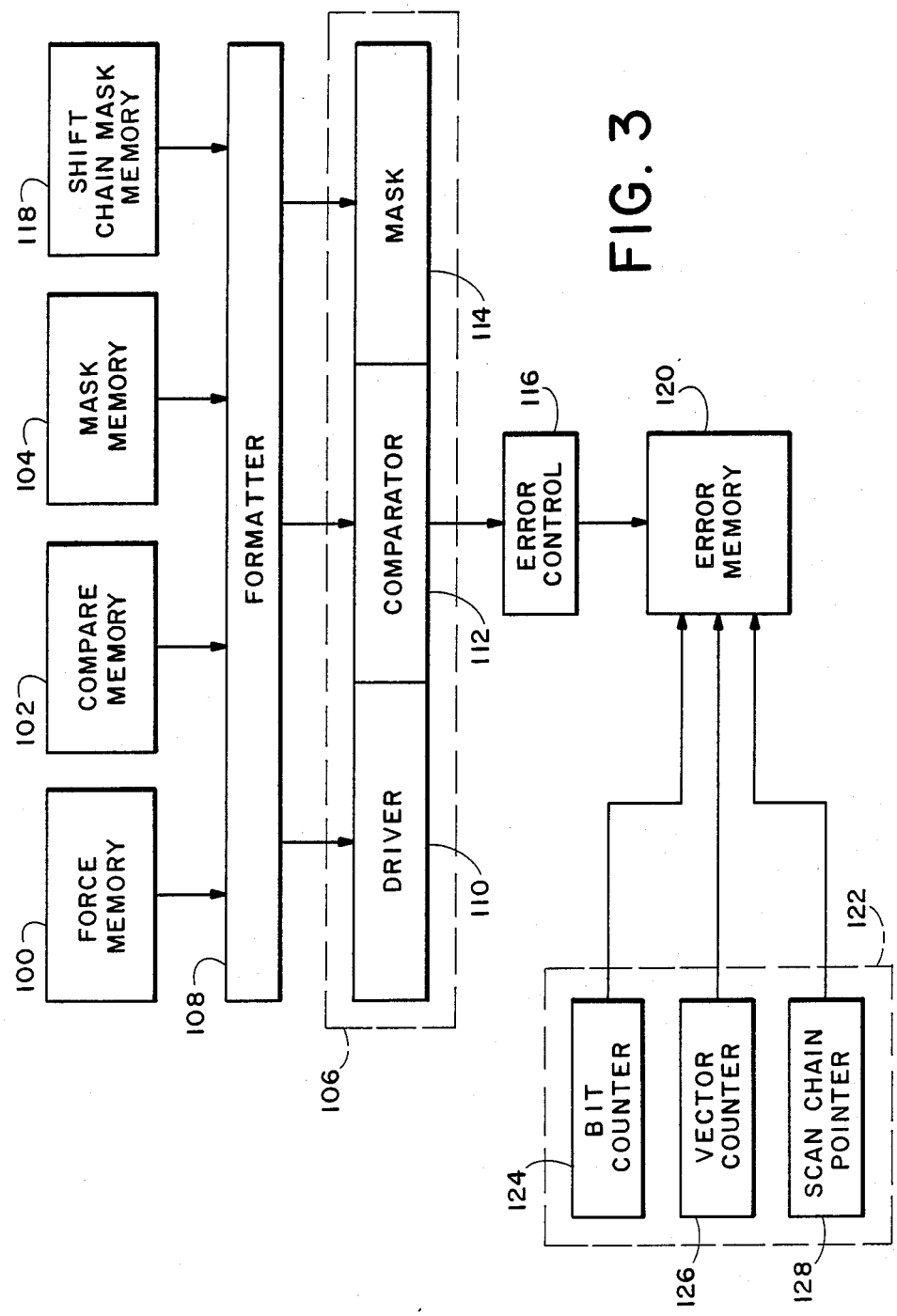
FIG. 3 is a block diagram of a system for implementing the invention.

The system shown in FIG. 3 is designed for use in testing an integrated circuit of the type having a diagnostic input port and a serial scan port. The diagnostic input port has 16 pins, and the serial scan port also has 16 pins, implying that when the circuit is placed in its diagnostic mode a vector group comprising 16 serial scan vectors is clocked out of the serial scan port. The invention is not, of course, restricted to testing circuits having 16 diagnostic input pins or 16 serial scan pins, and there is no necessary relation between the number of diagnostic input pins and the number of serial scan pins.

The data base used for carrying out a test comprises a force memory 100, a compare memory 102, and a mask memory 104. The force memory contains the sequence of vectors that is applied to the diagnostic input port of the device under test (DUT), while the compare memory contains the sequence of groups of serial scan vectors that will be obtained if the DIT does not contain a defect. The mask memory 104 contains information regarding particular digits of the serial scan vectors as to which no determination should be made. For example, it might be known from the mathematical model that a particular digit could, with equal validity, be either a one or a zero, or its value might be irrelevant to proper operation of the DUT. In addition, in the case of a device having I/O pins, that is pins that are used sometimes as input pins and at other times as output pins, the driver channel associated with an I/O pin is sometimes turned on to force data into the I/O pin and at other times is inhibited to allow data from the I/O pin to be examined, and during the time that the driver channel is turned on, comparisons on the I/O pin are masked.

The force memory 100, compare memory 102 and mask memory 104 interface with a test station 106 through a formatter 108 which operates in known manner to place the information contained in the memories in a form compatible with the test station. The test station itself comprises a multiple channel driver 110 whereby the input vectors contained in the force memory are applied to the diagnostic input port of the DUT, and a multiple channel comparator 112 whereby the serial scan vectors obtained from the DUT are compared with the contents of the compare memory. In the exemplary embodiment of the invention, the diagnostic input port has 16 pins and accordingly the driver 110 has 16 channels. The force memory is organized 64K by 16 and thus is able to apply a total of 64K input vectors, each having 16 bits, to the diagnostic input port of the DUT. Similarly, the comparator 112 has 16 channels which are respectively associated with the 16 pins of the serial scan port, so that for each clock pulse that is applied to the shift registers when the IC is in the diagnostic mode, one row of the matrix formed by a group of serial scan vectors is clocked into the comparator and the comparator compares the 16 digits of that row simultaneously with the 16 digits stored at the corresponding locations of the compare memory. It will be appreciated that the 16 serial scan chains are thereby clocked into the 16 comparator channels respectively. The compare memory is organized 64K by 16, and therefore each serial scan chain may have up to 64K digits. (In the art of testing integrated circuits with serial scan capability, the "serial scan chain" is the sequence of serial scan vectors that are provided at a given serial scan pin, i.e. the sequence of vectors corresponding to the like numbered columns of the successive matrices.

The test station also comprises a multiple channel mask 114. The mask is controlled by the mask memory 104. The mask memory is a 64K by 16 memory, and therefore the number of addressable locations in the mask memory is equal to the number of 16 digit words in the sequence of groups of serial scan vectors that can be clocked out of the DUT by way of its serial scan port and compared with corresponding words of the compare memory 102. One addressable location of the mask memory is associated with each 16 digit word of the sequence of groups of serial scan vectors.

Prior to carrying out a test, the mask memory is loaded with information indicating, for each addressable location, whether an indication of correctness should be given for the corresponding digit of the sequence of groups of serial scan vectors. As each 16 digit word is fetched from the compare memory and set up for comparison with a row of 16 digits clocked out of the serial scan port 28 of the DUT, the corresponding 16 digit word of the mask memory is fetched and if a digit of that word indicates that an error indication should not be given, the mask 114 disables the appropriate channel of the comparator 112 from providing an error indication.

If an error indication is provided by the comparator, it is applied to an error control 116 and information relating to the location of the error in the matrix is stored in an error memory 120.

As noted, each vector group that is clocked out of the serial scan port when the circuit is placed in its diagnostic mode comprises 16 serial scan vectors. Each vector can comprise up to 4K bits, for a total of 64K bits per vector group, and the size of the compare memory allows performance of a test in which the total number of bits in the vector groups that are generated may be up to 1024K, allowing, e.g., up to 16 vector groups each containing 64K bits.

In order to facilitate presentation and analysis of information pertaining to defects that are identified, the error pointer 122 comprises two counters 124 and 126 and a scan chain pointer 128. The bit counter 124 assigns a unique number to each bit position in the serial scan vector. In an implementation using ECL 10K logic, the bit counter is loaded with the 2's complement of the length of the serial scan vector, i.e., the number of rows in the matrix, and is incremented each time a new bit (i.e., a row of the matrix) is shifted out of the DUT. When the bit counter counts out, it is reset with its initial count and it increments the vector counter 126. It will therefore be seen that count accumulated in the vector counter 126 is representative of the number of serial scan vectors that have been examined up to that time.

When a defect is identified, the outputs of the vector counter and the bit counter indicate, respectively, which vector group is being examined and which bit position within the vector group is being examined. In addition, the scan chain pointer 128 is connected to the comparator and provides a 16-bit word (one bit associated with each comparator channel) identifying which of the 16 channels of the comparator provided the error indication.

The outputs of the bit counter 124, the vector counter 126 and the scan chain pointer 128 are stored in the error memory 120 for subsequent analysis. The error memory is organized 4K by 48. The 48-bit field is broken down into a 16-bit serial scan vector group number, a 16-bit serial scan bit number and a 16-bit number indicating which channel or channels provided the error indication. At the end of the test, the contents of the error memory 120 are transformed into information indicating the locations within the matrix of the digits for which error indications have been given, and this information is loaded into a shift chain mask memory 118.

The shift chain mask memory 118 is a 4K by 16 memory, and may be used in testing an IC having up to 4K digits in each serial scan vector of a group of 16 scan vectors. Thus, one digit of the serial scan mask memory is allocated to each digit of the group of serial scan vectors, and the contents of the shift chain mask memory indicate, for each digit of the matrix representing the group of serial scan vectors, whether a comparison of the value of that digit to the contents of the compare memory has given rise to an error indication in a previous test.

When the shift chain mask memory has been loaded, a second test is carried out under more severe conditions. As before, one or more test vectors are applied to the circuit when in the normal mode, and the circuit is placed in its diagnostic mode and a sequence of 16 digit words is read out from the serial scan port. As each word is read out from the serial scan port, the corresponding word is fetched from the shift chain mask memory. If a digit of the latter word indicates that an error indication has been given for that digit during a previous test, the mask 114 disables the appropriate channel of the comparator from providing an error indication to the operator of the system. Thus, for each location in the matrix, the operator of the system will not receive more than one error indication during a sequence of tests. If, for any digit of the matrix, the corresponding digit of the compare memory determines that an error indication should be given and this determination is not overriden by the mask memory 104 or the shift chain mask memory 118, an error indication is provided to the error control 116.

In addition to being loaded with information relating to the location of defects, the shift chain mask memory may be loaded with mask indications to compensate for unequal length serial scan vectors. Thus, if one serial scan vector were 10 digits shorter than the others, because the corresponding internal shift register contains 10 fewer cells than the other internal registers, but this was not reflected in the mathematical model and consequently in the contents of the mask memory 104, the shift chain mask memory 118 may be loaded to prevent comparisons after the digits actually stored in the shorter register have been shifted out. This insures that attempted comparisons will not give rise to error indications, and this is achieved without its being necessary to alter the contents of the data base, specifically the mask memory 104, and run the risk of introducing an error into the data base.

It will be readily apparent that by identifying the locations of defects by reference to the comparator channel, the vector group number and the bit number, information relating to occurrence of systematic errors can be extracted more readily than when the information is recorded simply by the position within the total number of bits of all the vector groups. For example, if there is a defect in the input to the third cell of the shift register that addresses channel 5 of the comparator, the error memory will indicate that an error has been detected by channel 5 at the third bit of each vector group, except when the "correct" value of that bit is the same as the value dictated by the defect. This pattern of information would reveal the existence and nature of the defect much more readily than would be the case if the information were recorded by bit position within the compare memory.

The system illustrated in FIG. 3 is implemented in hardware, using conventional logical building blocks. For this reason, a detailed schematic diagram of the test system has not been provided. It will be understood by those skilled in the art that the test system would comprise, in addition to the blocks illustrated in FIG. 3, a controller to establish sequences and timing of various operations. The manner of implementing such a controller is conventional.

It will be appreciated that the invention is not restricted to the particular method that has been described with reference to the drawings, and that variations may be made therein without departing from the scope of the invention as defined in the appended claims, and equivalents thereof. For example, the invention is not restricted to use with a system having a shift chain mask memory.

I claim:

1. A method of testing an electronic circuit having an input part for receiving input vectors, an output port for providing output vectors, and a serial scan port for providing at least one serial scan vector reflecting the status of pre-determined elements within the circuit, said method comprising applying a sequence of test vectors to the input port as a plurality of sub-sequences each including at least one test vector, examining the serial scan vector after each sub-sequence and determining whether a part of the serial scan vector indicates the presence of a defect in the circuit, and, in the event that a part of the serial scan vector indicates the presence of a defect in the circuit, storing information that indicates the number of serial scan vectors that have previously been examined and information that identifies which part of the serial scan vector indicates the presence of a defect in the circuit.

2. A method according to claim 1, wherein a plurality of serial scan vectors are provided in parallel by way of the serial scan port, and the method also comprises storing information that identifies which serial scan vector of the plurality includes the part that indicates the presence of a defect in the circuit.

3. A method according to claim 1, further comprising retrieving the stored information for subsequent analysis.

4. A method of testing an electronic circuit having an input port for receiving input vectors, an output port for providing output vectors, and a serial scan port for providing at least one serial scan vector reflecting the status of predetermined elements within the circuit, said method comprising applying at least one test vector to the input port, examining the serial scan vector after application of the test vector and determining whether a part of the serial scan vector indicates the presence of a defect in the circuit, and, in the event that a part of the serial scan vector indicates the presence of a defect in the circuit, storing information that identifies the part of the serial scan vector that indicates the presence of a defect in the circuit.

5. A method according to claim 4, wherein a plurality of serial scan vectors are provided in parallel by way of the serial scan port, and the method also comprises separately storing information that identifies which serial scan vector of the plurality includes the part that indicates the presence of a defect in the circuit.

6. A method according to claim 4, further comprising retrieving the stored information for subsequent analysis.

7. A method of testing an electronic circuit comprising an input logic stage having an input port for applying input vectors to the input logic stage, an output logic stage having an output port for providing output vectors from the output logic stage, storage elements interposed functionally between the input logic stage and the output logic stage, at least one scan input pin for loading a test vector into the storage elements, and at least one serial scan pin for providing at least one serial scan vector reflecting the status of the storage elements, said method comprising:
  (a) applying at least one test vector to the circuit,
  (b) examining the serial scan vector after application of the test vector and determining whether a part of the serial scan vector indicates the presence of a defect in the circuit, and, in the event that a part of the serial scan vector indicates the presence of a defect in the circuit,
  (c) storing information that identifies which part of the serial scan vector indicates the presence of a defect in the circuit.

8. A method according to claim 7, comprising the step of applying the sequence of test vectors to the circuit by way of the input port of the input logic stage.

9. A method according to claim 7, wherein a plurality of serial scan vectors are provided in parallel by way of the serial scan port, and the method also comprises storing information that identifies which serial scan vector of the plurality includes the part that indicates the presence of a defect in the circuit.

10. A method according to claim 7, comprising applying a sequence of test vectors to the circuit as a plurality of sub-sequences each including at least one test vector, examining the serial scan vector after each sub-sequence, and, in the event that a part of the serial scan vector indicates the presence of a defect in the circuit, storing information that indicates the number of serial scan vectors that have previously been examined.

* * * * *